(12) United States Patent
Shibata et al.

(10) Patent No.: US 9,202,998 B2
(45) Date of Patent: Dec. 1, 2015

(54) SEMICONDUCTOR LIGHT-EMITTING DEVICE AND METHOD FOR MANUFACTURING SEMICONDUCTOR LIGHT-EMITTING DEVICE

(71) Applicant: STANLEY ELECTRIC CO., LTD., Tokyo (JP)

(72) Inventors: Yasuyuki Shibata, Yokohama (JP); Ji-Hao Liang, Kawasaki (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 13/677,696

(22) Filed: Nov. 15, 2012

(65) Prior Publication Data
US 2013/0126925 A1    May 23, 2013

(30) Foreign Application Priority Data
Nov. 17, 2011    (JP) .................................. 2011-251271

(51) Int. Cl.
*H01L 33/58*    (2010.01)
*H01L 33/00*    (2010.01)
(Continued)

(52) U.S. Cl.
CPC .............. *H01L 33/58* (2013.01); *H01L 33/005* (2013.01); *H01L 33/0079* (2013.01);
(Continued)

(58) Field of Classification Search
CPC ......... H01L 33/16; H01L 33/20; H01L 33/22; H01L 33/34; H01L 33/58
USPC ................ 257/88, 98, 79, E33.006, E33.002, 257/E33.067, E33.074, E33.068; 438/22, 438/29
See application file for complete search history.

(56) References Cited

U.S. PATENT DOCUMENTS 7,667,224 B2    2/2010  Ohashi et al.
7,768,025 B2 *  8/2010  Jang et al. ....................... 257/98
(Continued)

FOREIGN PATENT DOCUMENTS

| JP | 2000-228539 A | 8/2000 |
| JP | 2005-516415 A | 6/2005 |
| JP | 2006253298 A | 9/2006 |
| JP | 2007165409 A | 6/2007 |
| JP | 2008172040 A | 7/2008 |
| JP | 2009043901 A | 2/2009 |
| JP | 2010092957 A | 4/2010 |

OTHER PUBLICATIONS

Japanese Office Action (and English translation thereof) dated Sep. 29, 2015, issued in counterpart Japanese Application No. 2011-251271.

*Primary Examiner* — Zandra Smith
*Assistant Examiner* — Lauren R Bell
(74) *Attorney, Agent, or Firm* — Holtz, Holtz, Goodman & Chick PC

(57) ABSTRACT

A semiconductor light-emitting device, and a method for manufacturing the semiconductor light-emitting device, in which light propagating through a light-emitting layer and reaching an edge surface of a semiconductor film can be extracted to the exterior in an efficient manner. The semiconductor light-emitting device comprises a semiconductor film including a light-emitting layer made from a group III nitride semiconductor. The semiconductor film has a tapered edge surface inclined diagonally with respect to a light extraction surface. The light extraction surface has a relief structure comprising a plurality of protrusions having a shape originating from the crystal structure of the semiconductor film. The average size of the protrusions in a first region in the vicinity of an edge section of the light extraction surface is smaller than the average size of the protrusions in a second region.

3 Claims, 10 Drawing Sheets

(51) Int. Cl.
*H01L 33/20* (2010.01)
*H01L 33/16* (2010.01)
*H01L 33/22* (2010.01)

(52) U.S. Cl.
CPC ............... *H01L 33/20* (2013.01); *H01L 33/16* (2013.01); *H01L 33/22* (2013.01); *H01L 2924/0002* (2013.01); *H01L 2933/0091* (2013.01)

(56) References Cited

U.S. PATENT DOCUMENTS

| 8,198,645 | B2 | 6/2012 | Sakai | |
| 2006/0202219 | A1 | 9/2006 | Ohashi et al. | |
| 2006/0204865 | A1* | 9/2006 | Erchak et al. | 430/7 |
| 2010/0264443 | A1* | 10/2010 | Wakai et al. | 257/98 |
| 2011/0227144 | A1 | 9/2011 | Yin et al. | |

\* cited by examiner

ANGLE OF INCIDENCE 0° - 12.7°

ANGLE OF INCIDENCE 12.7° - 14.9°

ANGLE OF INCIDENCE 14.9° - 33.1°

SEMICONDUCTOR LIGHT-EMITTING DEVICE AND METHOD FOR MANUFACTURING SEMICONDUCTOR LIGHT-EMITTING DEVICE

CROSS-REFERENCE TO RELATED APPLICATIONS

This application is based on Japanese Patent Application No. 2011-251271 filed Nov. 17, 2011, which is herein incorporated by reference.

BACKGROUND OF THE INVENTION

1. Field of the Invention

The present invention relates to a semiconductor light-emitting device such as a light-emitting diode (LED), and in particular, relates to a technique for enhancing light extraction in a semiconductor light-emitting device.

2. Description of the Related Art

The efficiency and output of LEDs and other semiconductor light-emitting devices are increasing owing to technological advances in recent years. However, with the increase in output, the amount of heat generated from the light-emitting element has also increased, and the resulting decrease in reliability is becoming an issue. In order to solve this problem, there have been proposed LEDs of a so-called thin-film structure, in which the growth substrate, used for crystal growth, having a relatively low thermal conductivity is removed, and the semiconductor layer is instead supported by a member having a relatively high thermal conductivity. According to the thin-film structure, the heat dissipation performance of the light-emitting element is improved, and an enhancement of the light extraction efficiency can be expected by the removal of the growth substrate. The laser lift-off (LLO) method, in which laser is directed from the reverse-surface side of the growth substrate and GaN is caused to degrade, is known as an example of a method for separating the growth substrate from a semiconductor film containing a GaN-based semiconductor crystal.

CITATION LIST

Patent Literature

PTL 1: Japanese Patent Kokai No. 2005-516415
PTL 2: Japanese Patent Kokai No. 2000-228539

SUMMARY OF THE INVENTION

FIG. 1A is a cross-sectional view showing the configuration of a semiconductor light-emitting device having a conventional thin-film structure, and FIG. 1B is an expanded cross-sectional view of the vicinity of an edge section of a semiconductor film 20 forming the semiconductor light-emitting device. The semiconductor film 20, which comprises GaN or another group-III nitride semiconductor, is formed by sequentially laminating an n-type semiconductor layer 23, a light-emitting layer 22, and a p-type semiconductor layer 21 on a sapphire substrate or another growth substrate (not shown) by metal organic chemical vapor deposition (MOCVD).

A relief structure for enhancing the light extraction efficiency is formed on the light extraction surface (i.e., the surface of the n-type semiconductor layer) of the semiconductor film 20. For example, performing wet etching on the light extraction surface of the semiconductor film 20 using KOH or another alkaline solution forms a relief structure comprising a plurality of hexagonal-cone-shaped protrusions 200 originating from a wurtzite-type crystal structure. These hexagonal-cone-shaped protrusions are called microcones. FIG. 2A is a side view of a hexagonal-cone-shaped protrusion 200 obtained by etching a group III nitride semiconductor with an alkaline solution, and FIG. 2B is a cross-sectional view along line 2b-2b in FIG. 2A. The cross-sectional shape of the hexagonal-cone-shaped protrusion 200 is an isosceles triangle having a base angle of 57° and an apex angle of 66°. Forming a plurality of hexagonal-cone-shaped protrusions on the light extraction surface makes it possible to extract to the exterior, in an efficient manner, light travelling to the light extraction surface at an angle greater than the critical angle, resulting in a dramatic increase in light extraction efficiency.

A reflection electrode 40 forming a light-reflecting surface, and an ITO film 30, are formed on the surface of the semiconductor film 20 on the opposite side from the light extraction surface (i.e., on the surface of the p-type semiconductor layer) in order to achieve electrical contact with the semiconductor film 20. A cap layer 50 completely covers the ITO film 30 and the reflection electrode 40, and prevents diffusion, into the reflection electrode 40, of AuSn or another eutectic bonding material for bonding a support substrate 60 and the semiconductor film 20. The support substrate 60 is, e.g., a Si substrate having a higher thermal conductivity than a sapphire substrate, and is bonded to the cap layer 50 interposed by a eutectic bonding layer.

The semiconductor film 20 is divided into a plurality of pieces by grid-shaped division grooves (streets) demarcating a section of the semiconductor light-emitting device. If the division grooves are formed by dicing, the edge surfaces (side surfaces) of the separated semiconductor film 20 will be rough, causing current leak to occur. Therefore, the division grooves are often formed by etching. Etching for forming the division grooves is normally performed before the sapphire substrate is removed. Therefore, etching is performed from the surface on the opposite side from the light extraction surface (i.e., on the surface of the p-type semiconductor layer). As a result, the cross-section profile of the semiconductor film 20 has a mesa shape that is broader on the light-extraction-surface side, and the edge surfaces 20a of the semiconductor film 20 is inclined by about 40° to 60° relative to the light extraction surface as shown in FIGS. 1A and 1B.

In a group III nitride semiconductor generating blue light, the light-emitting layer can be made from, e.g., InGaN. There is also formed a so-called double heterostructure in which the light-emitting layer is sandwiched between layers comprising GaN or AlGaN, which have a larger band gap than InGaN forming the light-emitting layer. The InGaN layer forming the light-emitting layer has a greater refractive index than the adjacent GaN layer or AlGaN layer; therefore, there exists light that propagates through the light-emitting layer while being trapped within the light-emitting layer. Such light propagates through the light-emitting layer, and arrives at the edge surface 20a of the semiconductor film 20. If the edge surface 20a of the semiconductor film is inclined by, e.g., 45° relative to the light extraction surface, light arriving at the edge surface 20a of the semiconductor film 20 is reflected by the edge surface 20a and travels towards the light extraction surface at an angle orthogonal to the light extraction surface (i.e., at an angle of incidence of 0°). Here, the angle of incidence refers to an angle formed between incident light and the normal to a flat light extraction surface where it is assumed that the relief structure is absent. Owing to the relief structure formed on the light extraction surface of the semiconductor film 20, as described above, light travelling to the light extraction surface at an angle greater than the critical angle can be extracted to the exterior in an efficient manner, whereas it may not be possible to extract, to the exterior, light travelling to the light extraction surface at an angle smaller than the critical angle. In other words, much of the light propagating through the light-emitting layer and reflecting at the inclined edge surface 20a of the semiconductor film 20 travels to the light extraction surface at an angle smaller than the critical angle, and can therefore not be extracted to the exterior, causing a decrease in the light extraction efficiency. In an element of such description, the region of the light-emitting layer that contributes towards the actual light emission is mainly the region immediately above the electrode; therefore, only this region is shown in the drawings.

There is a possibility that, as shown, e.g., in FIG. 3A, light travelling to the light extraction surface at an angle of incidence (an angle formed between incident light and the normal to a flat light extraction surface where it is assumed that the relief structure is absent; the same definition applies hereafter) equal to or greater than 0° and less than 12.7° is reflected by the side surface of the hexagonal-cone-shaped protrusion 200 and temporarily extracted to the exterior, but then re-enters an adjacent hexagonal-cone-shaped protrusion. As shown in FIG. 3B, light travelling to the light extraction surface at an angle of incidence equal to or greater than 12.7° and less than 14.9° is reflected by the side surface of the hexagonal-cone-shaped protrusion 200 and temporarily extracted to the exterior, but exits at a downward angle, and therefore inevitably re-enters an adjacent hexagonal-cone-shaped protrusion. As shown in FIG. 3C, light travelling to the light extraction surface at an angle of incidence equal to or greater than 14.9° and less than 33.1° is reflected by the side surface of the hexagonal-cone-shaped protrusion 200 without being extracted to the exterior, and is returned to the light-emitting-layer side. Thus, in an instance in which the light extraction surface has a uniform relief structure, much (4 to 7%) of light propagating through the light-emitting layer and reflecting at the edge surface 20a of the semiconductor film 20 cannot be extracted to the exterior.

The present invention has been conceived in light of the above-mentioned points, it being an object of the present invention to provide a semiconductor light-emitting device, and a method for manufacturing a semiconductor light-emitting device, in which light propagating through a light-emitting layer and reflecting at the edge surface of the semiconductor film can be extracted to the exterior in an efficient manner.

The method for manufacturing a semiconductor light-emitting device according to the present invention comprises: a semiconductor film formation step for forming a semiconductor film, including a light-emitting layer, on a growth substrate; a support substrate bonding step for bonding a support substrate on the semiconductor film interposed by a reflection electrode; a growth substrate removal step for removing the growth substrate; an offset surface revealing step for revealing, in a first region in the vicinity of an edge section of a surface of the semiconductor film exposed by the removal of the growth substrate, an offset surface, which is offset relative to a crystal surface revealed in a second region further inwards from the first region; and a relief structure formation step for performing a wet etching treatment on the surface of the semiconductor film and forming, in the first region and second region, a relief structure comprising a plurality of protrusions having a shape originating from the structure of crystals in the semiconductor film.

A semiconductor light-emitting device according to the present invention comprises: a semiconductor film including a light-emitting layer made from a group III nitride semiconductor; a reflection electrode provided to a surface of the semiconductor film on the opposite side from a light extraction surface; and a support substrate bonded to the reflection electrode interposed by a bonding layer; the semiconductor film having a tapered edge surface that is inclined relative to the light extraction surface; the light extraction surface having a relief structure comprising a plurality of protrusions having a shape originating from the structure of crystals in the semiconductor film; and the average size of the protrusions in a first region in the vicinity of an edge section of the light extraction surface being smaller than the average size of the protrusions in a second region, further inward from the first region, of the light extraction surface.

According to the semiconductor light-emitting device of the present invention, the average size of the hexagonal-cone-shaped protrusions formed in the first region is smaller than the average size of the hexagonal-cone-shaped protrusions formed in the second region. Therefore, it becomes possible to efficiently extract, to the exterior, light propagating laterally through the light-emitting layer, reflecting at the tapered edge surface, and travelling towards the light extraction surface; and to enhance the light extraction efficiency in comparison to that according to conventional techniques.

According to the method for manufacturing a semiconductor light-emitting device according to the present invention, it becomes possible to manufacture a semiconductor light-emitting device having the above-mentioned effects using a relatively simple method.

DESCRIPTION OF THE PREFERRED EMBODIMENTS

Figure 1A:
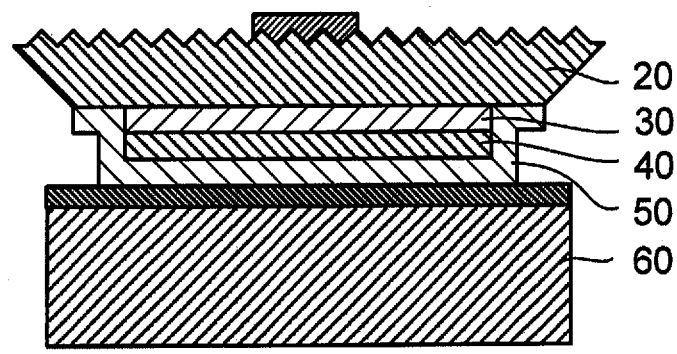
FIG. 1A is a cross-sectional view showing the configuration of a semiconductor light-emitting device having a conventional thin-film structure.

Embodiments of the present invention will now be described with reference to the accompanying drawings. In the drawings referred to below, constituent elements and portions that are substantively identical or equivalent are affixed with identical numerals.

Figure 4A:
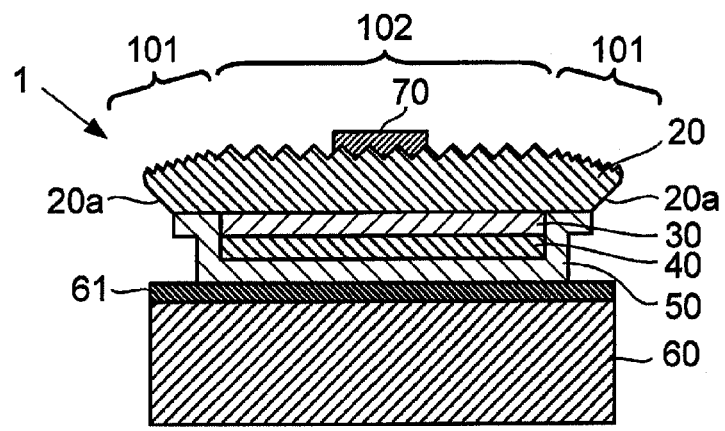
FIG. 4A is a cross-sectional view showing the configuration of a semiconductor light-emitting device according to an embodiment of the present invention.
Figure 4B:
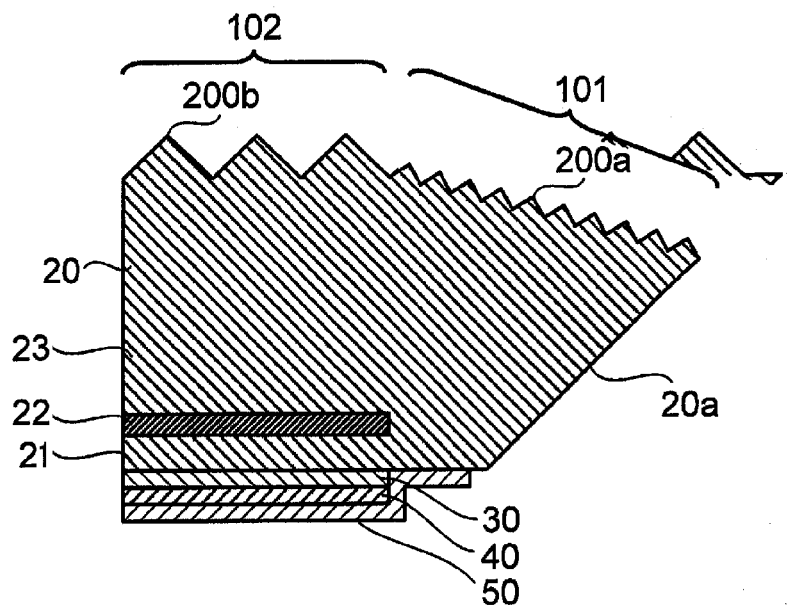
FIG. 4B is an expanded cross-sectional view of the vicinity of the edge section of a semiconductor film according to the embodiment of the present invention.
Figure 4C:
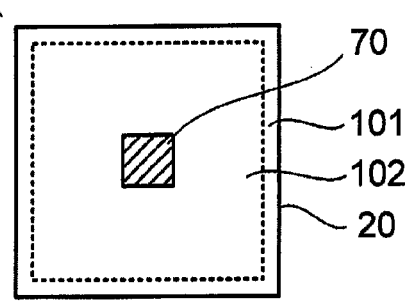
FIG. 4C is a plan view in which the semiconductor light-emitting device according to the embodiment of the present invention is viewed from the side towards the light extraction surface.

FIG. 4A is a cross-sectional view showing the configuration of a semiconductor light-emitting device 1 according to an embodiment of the present invention, FIG. 4B is an expanded cross-sectional view of the vicinity of the edge section of a semiconductor film 20 forming the semiconductor light-emitting device 1, and FIG. 4C is a plan view of the semiconductor light-emitting device 1 when viewed from the light-extraction-surface side.

The semiconductor light-emitting device 1 is an LED having a thin-film structure in which a semiconductor film 20 is supported by a support substrate 60 other than a growth substrate used for crystal growth for the semiconductor film. The semiconductor film 20 is formed by layering an n-type semiconductor layer made from a group III nitride semiconductor, a light-emitting layer 22, and a p-type semiconductor layer 21; the surface of the n-type semiconductor layer 23 corresponds to a light extraction surface. A relief structure comprising a plurality of hexagonal-cone-shaped protrusions originating from a wurtzite-type crystal structure is formed on the surface of the n-type semiconductor layer representing the light extraction surface. An n-electrode 70 is formed on the light extraction surface (surface of the n-type semiconductor layer) on which the relief structure is formed.

An ITO film 30 for achieving electrical contact with the semiconductor film 20 is formed on the surface of the semiconductor film 20 on the opposite side from the light extraction surface (i.e., on the surface of the p-type semiconductor layer). Specifically, the ITO film 30 forms ohmic contact with the semiconductor film 20. The ITO film 30 is formed so as to cover a relatively large area of the surface of the semiconductor film 20, and is patterned into squares, rectangles, or other shapes. A reflection electrode 40 made from Ag or another metal having a high reflectivity is formed on the surface of the ITO film 30. The reflection electrode 40 forms a light-reflecting surface on the interface with the ITO film 30, and reflects light emitted form the light-emitting layer towards the light extraction surface. A cap layer 50 is provided so as to completely cover the layered body comprising the ITO film 30 and the reflection electrode 40. The cap layer 50 includes a Ti layer and a TiW layer having a barrier function with respect to AuSn and other eutectic bonding materials.

The support substrate 60 comprises a Si substrate or another substrate having a higher thermal conductivity than the sapphire substrate used for crystal growth for the semiconductor film 20. The support substrate 60 is bonded to the cap layer 50 interposed by a eutectic metal layer 61 made from AuSn or another eutectic bonding material.

The edge surface (side surface) 20a of the semiconductor film 20 has a tapered shape, inclined diagonally with respect to the light extraction surface, caused by etching performed when division grooves (streets) are formed on the semiconductor film 20. Specifically, the semiconductor film 20 has a mesa shape in which the width at the side towards the light-extraction surface is greater than the width at the side towards the reflection electrode 40.

Figure 2A:
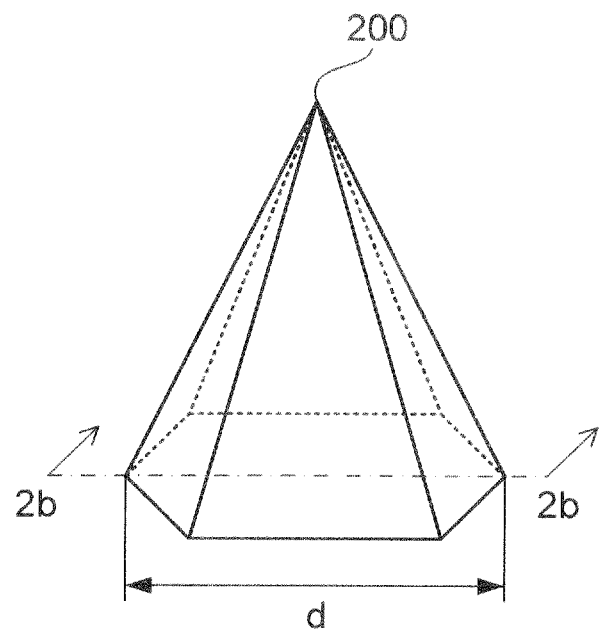
FIG. 2A is a side view of a hexagonal-cone-shaped protrusion obtained by etching a group III nitride semiconductor using an alkali solution.
Figure 2B:
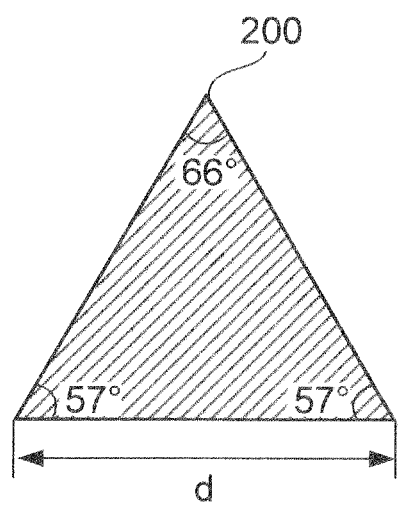
FIG. 2B is a cross-sectional view along line 2b-2b in FIG. 2A.
Figure 3A:
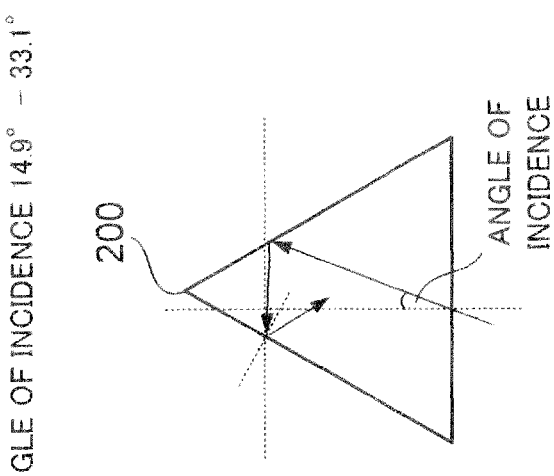
FIGS. 3A through 3C are show the relationship between the angle of incidence of light with respect to the light extraction surface and the light path.
Figure 3B:
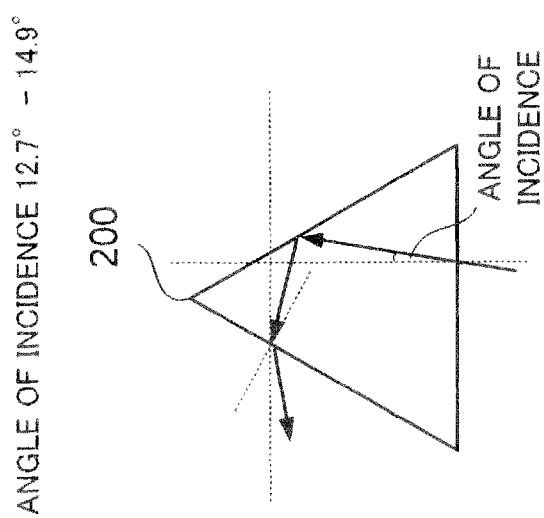
Figure 3C:
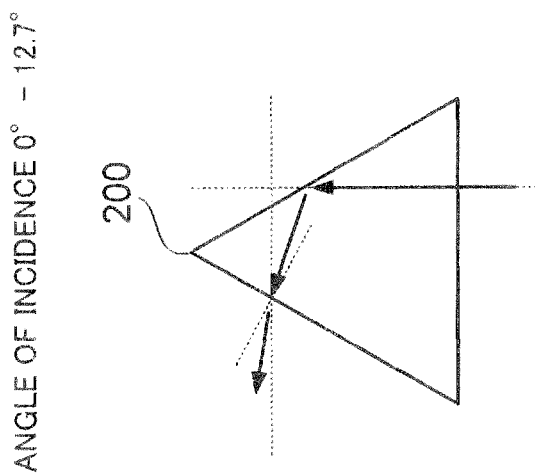

The average size (average diameter) of a plurality of hexagonal-cone-shaped protrusions 200a formed in a first region 101 in the vicinity of an edge section of the light extraction surface of the semiconductor film 20, including a region immediately above the tapered edge surface 20a, is smaller than the average size (average diameter) of a plurality of hexagonal-cone-shaped protrusions 200b formed in a second region 102, further inward from the first region 101, including a region immediately above the reflection electrode 40. Specifically, a large number of hexagonal-cone-shaped protrusions 200a having a diameter that is sufficiently smaller than the wavelength of light emitted from the light-emitting layer (e.g., 450 nm) are formed in the first region 101. Meanwhile, a large number of hexagonal-cone-shaped protrusions 200b having a diameter that is sufficiently larger than the wavelength of light emitted from the light-emitting layer are formed in a second region 102. The diameter of the hexagonal-cone-shaped protrusion corresponds to the length d of a line segment linking two opposing vertices of the base surface of the hexagonal cone (see FIGS. 2A, 2B).

Figure 5:
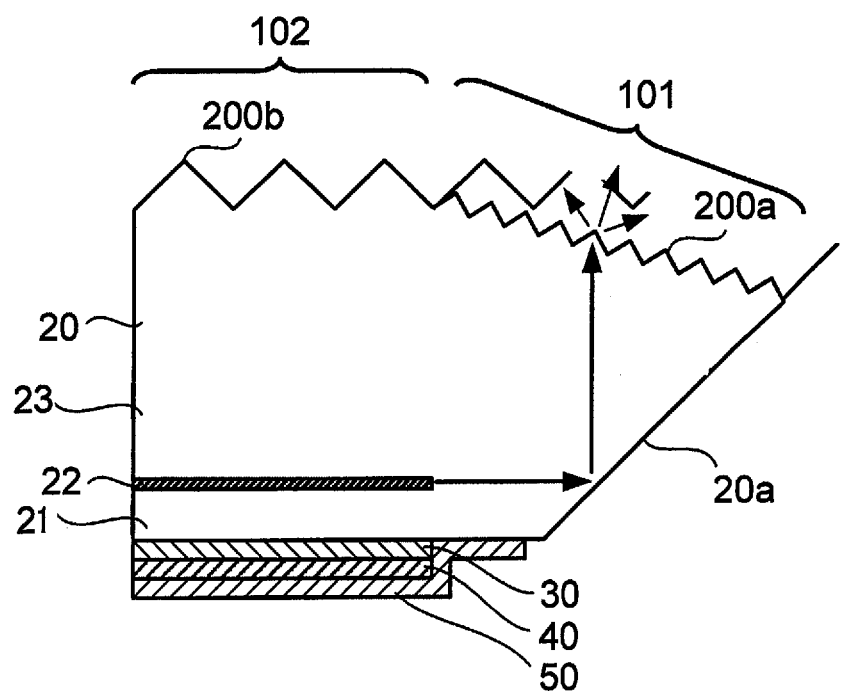
FIG. 5 is a cross-sectional view showing the path of light propagating laterally through the light-emitting layer and arriving at the tapered edge surface, in a semiconductor light-emitting device according to the embodiment of the present invention.

FIG. 5 is a cross-sectional view showing the path of light propagating laterally through the light-emitting layer 22 and arriving at the tapered edge surface 20a in a semiconductor light-emitting device according to the embodiment of the present invention. Light that has propagated through the light-emitting layer 22 and arrived at the edge surface 20a is reflected by the tapered edge surface 20a and travels to the light extraction surface at an angle of incidence smaller than the critical angle. Many of the hexagonal-cone-shaped protrusions 200a formed in the first region 101 in the vicinity of the edge section of the light extraction surface of the semiconductor film 20 have a diameter that is sufficiently smaller than the wavelength of the light emitted from the light-emitting layer; therefore, light travelling to the light extraction surface at an angle of incidence smaller than the critical angle is extracted to the exterior without being reflected by the side surfaces of the hexagonal-cone-shaped protrusions 200a. A low-reflection structure caused by minute microcones thus being formed in the first region 101 makes it possible to efficiently extract, to the exterior, light propagating laterally through the light-emitting layer 22 and arriving at the tapered edge surface 20a. Also, light extracted to the exterior from the first region 101 is diffused and scattered by the hexagonal-cone-shaped protrusions 200a that are smaller than the emission wavelength, and it is therefore possible to prevent light exiting from this region from exiting disproportionally in a specific direction. Specifically, light propagating through the light-emitting layer is concentrated in the first region 101, and the density of light extracted to the exterior from the first region 101 is relatively high. If the first region 101 is a flat light extraction surface, highly dense light exits disproportionately in a specific direction, and brightness unevenness and color unevenness on the light extraction surface become prominent.

Meanwhile, in the region immediately above the reflection electrode 40, light travelling in a variety of directions travel to the light extraction surface. Therefore, in the second region 102 including the region immediately above the reflection electrode 40, forming hexagonal-cone-shaped protrusions 200b having a diameter that is sufficiently larger than the emission wavelength would be beneficial for extracting light.

Thus, a relief structure mainly comprising a plurality of hexagonal-cone-shaped protrusions that are sufficiently smaller than the emission wavelength are formed in the first region 101 in the vicinity of the edge section of the light extraction surface including the region immediately above the edge surface 20a, and a relief structure mainly comprising a plurality of hexagonal-cone-shaped protrusions that are sufficiently larger than the emission wavelength are formed in the second region 102 including the region immediately above the reflection electrode 40, whereby it becomes possible to extract light that has been conventionally difficult to extract to the exterior, and to obtain a higher light extraction efficiency than that according to conventional techniques. In order to obtain a light extraction efficiency that is significantly higher than that according to conventional techniques, those among the plurality of hexagonal-cone-shaped protrusions 200a formed in the first region 101 that have a diameter smaller than the wavelength of light emitted from the light-emitting layer preferably have an area occupancy of at least 70%, and those among the plurality of hexagonal-cone-shaped protrusions 200b formed in the second region 102 having a diameter larger than the wavelength of light emitted from the light-emitting layer preferably have an area occupancy of at least 40%.

A description will now be given for a method for manufacturing the semiconductor light-emitting device 1 having the above configuration. FIGS. 6A to 6E and 7A to 7E are cross-sectional views illustrating the manufacturing method according to a first embodiment of the present invention.

(Semiconductor Film Formation Step)

Figure 6A:
FIGS. 6A through 6E are cross-sectional views showing a method for manufacturing a semiconductor light-emitting device according to an embodiment of the present invention.

A sapphire substrate 10, used as a growth substrate for semiconductor crystal growth, is prepared. The sapphire substrate 10 is heated at 1000° C. for 10 minutes under a hydrogen atmosphere, and thermal cleaning is performed on the sapphire substrate 10. Next, a semiconductor film 20 comprising a low-temperature buffer layer, a GaN underlayer, an n-type GaN layer, a light-emitting layer, a p-type AlGaN cladding layer, and a p-type GaN layer is formed on the sapphire substrate 10 by metal organic chemical vapor deposition (MOCVD). Specifically, the substrate temperature is brought to 500° C.; trimethyl gallium (TMG) (flow rate: 10.4 µmol/min) and $NH_3$ (flow rate: 3.3 LM) are fed for approximately 3 minutes; and a low-temperature buffer layer comprising GaN is formed on the sapphire substrate 10. Then, the substrate temperature is raised to 1000° C. and maintained at this temperature for approximately 30 seconds, whereby the low-temperature buffer layer is crystallized. Next, TMG (flow rate: 45 µmol/min) and $NH_3$ (flow rate: 4.4 LM) are fed for approximately 20 minutes while the substrate temperature is maintained at 1000° C., and a GaN underlayer having a thickness of approximately 1 µm is formed. Next, TMG (flow rate: 45 µmol/min), $NH_3$ (flow rate: 4.4 LM), and, as a dopant gas, $SiH_4$ (flow rate: $2.7 \times 10^{-9}$ mol/min) are fed for approximately 100 minutes at a substrate temperature of 1000° C., and an n-type GaN layer having a thickness of approximately 5 µm is formed. Next, a light-emitting layer is formed on the n-type GaN layer. In the present embodiment, a multiple quantum well structure comprising InGaN/GaN is used as the light-emitting layer. Where InGaN/GaN is one cycle, 5 growth cycles are performed. Specifically, the substrate temperature is brought to 700° C., and TMG (flow rate: 3.6 µmol/min), trimethyl indium (TMI) (flow rate: 10 µmol/min), $NH_3$ (flow rate: 4.4 LM) are fed for approximately 33 seconds, and a InGaN well layer having a thickness of approximately 2.2 nm is formed; then, TMG (flow rate: 3.6 µmol/min) and $NH_3$ (flow rate: 4.4 LM) are fed for approximately 320 seconds and a GaN barrier layer having a thickness of approximately 15 nm is formed. This process is repeated for 5 cycles, whereby the light-emitting layer is formed. Next, the substrate temperature is raised to 870° C.; TMG (flow rate: 8.1 µmol/min), trimethyl aluminum (TMA) (flow rate: 7.5 µmol/min), $NH_3$ (flow rate: 4.4 LM), and, as a dopant, $Cp_2Mg$ (bis-cyclopendathenyl Mg) (flow rate: $2.9 \times 10^{-7}$ µmol/min) are fed for approximately 5 minutes; and a p-type AlGaN cladding layer having a thickness of approximately 40 nm is formed. Then, TMG (flow rate: 18 µmol/min), $NH_3$ (flow rate: 4.4 LM), and, as a dopant, $Cp_2Mg$ (flow rate: $2.9 \times 10^{-7}$ µmol/min) are fed for approximately 7 minutes while the substrate temperature is maintained; and a p-type GaN layer having a thickness of approximately 150 nm is formed. A semiconductor film 20 comprising the layers described above is formed on the sapphire substrate 10 (FIG. 6A).

(p-Type GaN Layer Activation Step)

The wafer is removed from the MOCVD device, and the p-type GaN layer is activated. In the course of the growth process, hydrogen, which is an ingredient of the carrier gas, is incorporated in the p-type GaN layer, and Mg—H bonds are formed. In this state, the Mg used for doping fails to fulfil the function of a dopant, and the resistance of the p-type GaN layer is higher. Therefore, it is necessary to perform an activation step for separating hydrogen incorporated into the p-type GaN layer. Specifically, heat treatment is performed on the wafer in a 700° C. inert gas atmosphere, and the p-type GaN layer is activated.

(ITO Film Formation Step)

Figure 6B:
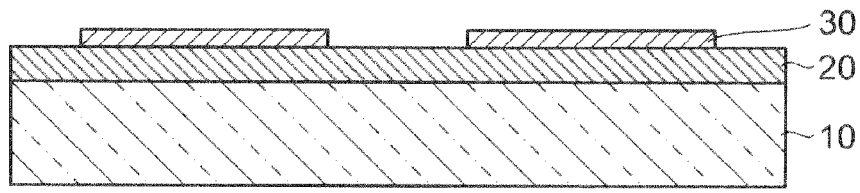

After the surface of the p-type GaN layer of the semiconductor film 20 is washed, the substrate temperature is brought to approximately 200° C., and the ITO film 30 having a thickness of approximately 40 nm is formed by sputtering on the surface of the p-type GaN layer. Next, a resist mask (not shown) having a grid-shaped opening pattern that traces division lines for demarcating individual sections of the semiconductor light-emitting device is formed on the ITO film 30, and the ITO film 30 is removed by wet etching, through the resist mask, using a mixture of nitric acid and hydrochloric acid; and the ITO film 30 is patterned. The wet etching forms grid-shaped grooves, which trace the division lines, on the ITO film 30; and divides the ITO film 30 into sections corresponding to each light-emitting element formed in the wafer. Patterning is performed so that each piece of the divided ITO film 30 is square or rectangular in shape. The resist mask is removed; then, the wafer is placed in an atmosphere containing oxygen at a temperature of 450° C., and heat treatment is performed for 1 minute. This heat treatment forms an ohmic contact between the ITO film 30 and the semiconductor film 20, and significantly reduces contact resistance (FIG. 6B).

(Reflection Electrode Formation Step)

Figure 6C:
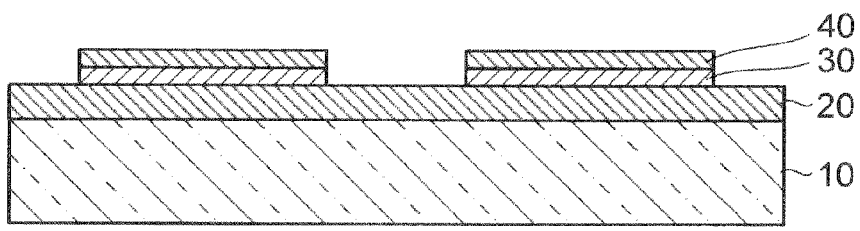

A resist (not shown) having openings is formed on the ITO film 30; then, the surface of the ITO film 30 is cleansed by reverse sputtering. Next, an Ag film having a thickness of about 150 nm is formed by sputtering on the entire surface of the wafer. Then, the unnecessary portions of the Ag film are removed with the above resist, whereby the Ag film is patterned and the reflection electrode 40 is formed (FIG. 6C).

(Cap Layer Formation Step)

Figure 6D:
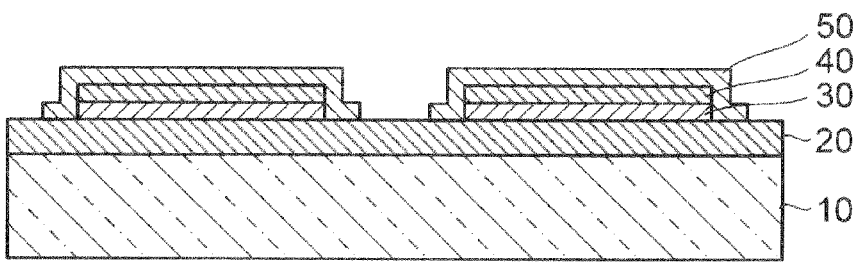

There is formed a resist (not shown) having openings on portions corresponding to the regions in which the ITO film 30 is formed. Next, TiW (thickness: 400 nm), Ti (thickness: 100 nm), Pt (thickness: 200 nm), and Au (thickness: 200 nm) are sequentially deposited, using sputtering or a similar method, so as to cover the entirety of the layered body comprising the ITO film 30 and the reflection electrode 40; unnecessary portions are subsequently removed together with the above resist; whereby patterning is performed and the cap layer 50 is formed (FIG. 6D). Of the above metals forming the cap layer 50, the TiW layer and the Ti layer function as barrier layers for preventing AuSn forming the eutectic metal layer 61 from diffusing into the reflection electrode 40. The Pt layer and the Au layer are layers for enhancing the wetting performance with respect to AuSn.

(Division Grooves Formation Step)

Figure 6E:
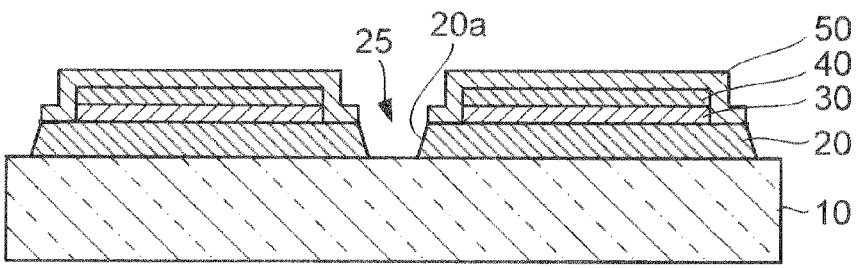

Division grooves (streets) 25 for demarcating single sections of the semiconductor light-emitting device are formed on the semiconductor film 20. Specifically, a resist (not shown) having a grid-shaped pattern corresponding to the pattern of the division grooves 25 is formed on the surface of the semiconductor film 20. Next, the wafer is placed in a reactive ion etching (RIE) device, and dry etching is performed using $Cl_2$ plasma, whereby the semiconductor film 20 exposed through the openings of the above resist is etched from the side towards the p-type GaN layer. Grid-shaped division grooves 25 reaching the sapphire substrate 10 are thereby formed in the semiconductor film 20, and the semiconductor film 20 is divided into pieces (chips) in which one side measures, e.g., 1000 μm. Edge surfaces (side surfaces) 20a of the pieces of the semiconductor film 20 have a tapered shape inclining diagonally with respect to the light extraction surface. In other words, the pieces of the semiconductor film 20 become mesa-shaped (FIG. 6E).

(Support Substrate Bonding Step)

Figure 7A:
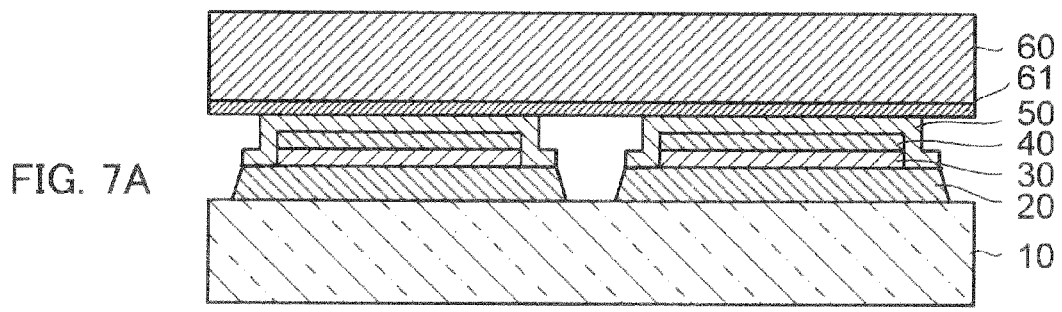
FIGS. 7A through 7E are cross-sectional views illustrating a method for manufacturing a semiconductor light-emitting device according to an embodiment of the present invention.

A support substrate 60 for supporting the semiconductor film 20 is prepared. The support substrate 60 is preferably a member having, e.g., a higher thermal conductivity than that of the sapphire substrate 10 and sufficient mechanical strength for supporting the semiconductor film 20. For example, a silicon substrate, a ceramic substrate, a glass epoxy substrate, or a metal substrate can be used as the support substrate 60. A eutectic metal layer 61 comprising AuSn, which is a eutectic bonding material, or a similar material is formed on the surface of the support substrate 60. the eutectic metal layer 61 and the cap layer 50 are brought into intimate contact and subjected to thermal compression in a vacuum, whereby the semiconductor film 20 and the support substrate 60 are bonded (FIG. 7A).

(Growth Substrate Removal Step)

Figure 7B:
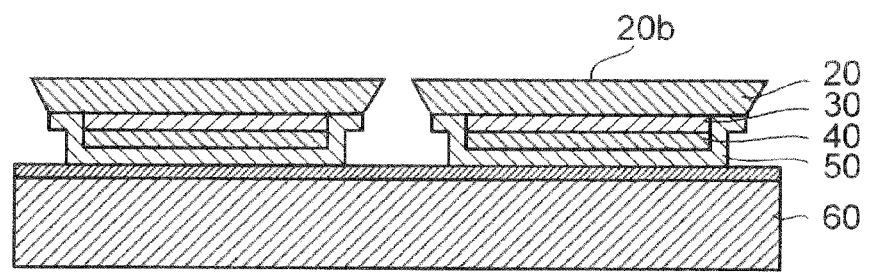

The sapphire substrate 10 is separated from the semiconductor film 20. Laser lift-off can be used to separate the sapphire substrate 10. Specifically, an eximer laser is beamed from the reverse surface of the sapphire substrate 10 (the surface on the opposite side from the surface on which the semiconductor film 20 is formed). GaN crystals in the vicinity of the interface with the sapphire substrate 10 are thereby broken down into Ga and $N_2$ gas, and the sapphire substrate 10 separates from the semiconductor film 20. Removing the sapphire substrate 10 exposes the surface 20b of the n-type GaN layer. The surface 20b of the n-type GaN layer comprises a C-plane, and wet etching treatment in which an alkali solution is used can be performed to form a relief structure comprising a plurality of hexagonal-cone-shaped protrusions having a shape originating from a wurtzite-type crystal structure. Ga, adhering to the surface 20b of the n-type GaN layer exposed by the removal of the sapphire substrate 10, is removed using HCl (FIG. 7B).

(Offset Surface Revealing Step)

Figure 7C:
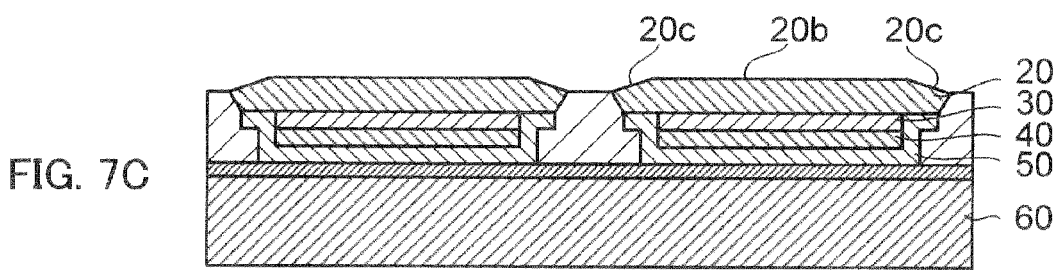
Figure 8:
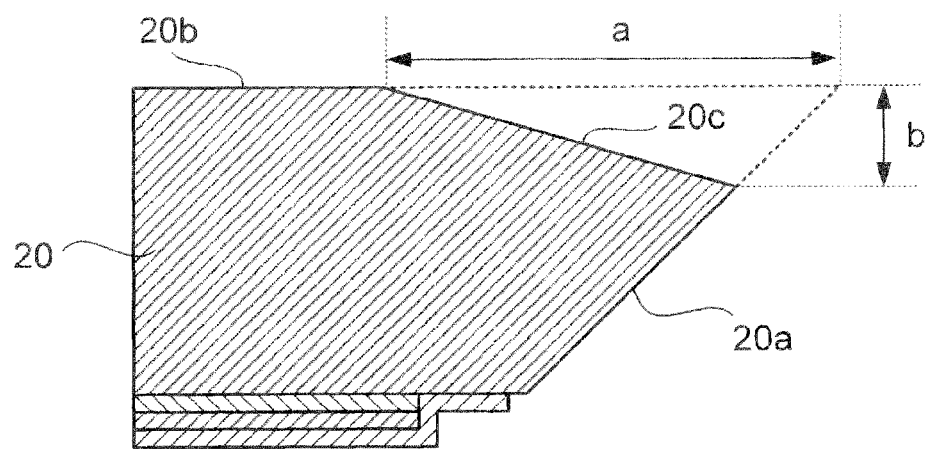
FIG. 8 is a cross-sectional view of the vicinity of the edge section of the semiconductor film that has been subjected to a polishing treatment in the offset surface revealing step according to the embodiment of the present invention.

A resist 80 is embedded into the division grooves 25; then, the surface (C-plane) 20b of the n-type GaN layer, exposed by the removal of the sapphire substrate 10, is polished using the chemical mechanical polishing (CMP) technique. The edge sections of the surface (C-plane) 20b of the n-type GaN layer are thereby chamfered, and offset surfaces 20c, which are offset from the C-plane, are revealed in the vicinity of the edge sections (FIG. 7C). FIG. 8 is a cross-sectional view of the vicinity of an edge section of the semiconductor film 20 after the polishing treatment. For example, a range corresponding to 10 μm in width a from the edge section of the semiconductor film 20 and approximately 1 μm in depth b from the light extraction surface is removed by polishing. An offset surface 20c, offset from the C-plane 20b by approximately 5.7°, is thereby revealed in the vicinity of the edge section of the semiconductor film 20. The offset surface 20c is formed directly above the tapered edge surface 20a of the semiconductor film 20.

Polishing of the semiconductor film 20 is preferably performed while the polishing pressure and the rotation speed of the polishing pad are varied as shown in Table 1. Specifically, reducing the polishing pressure and the rotation speed in step 1 at the initial stage and step 3 at the final stage of the polishing treatment makes it possible to reduce cracking or chipping of the semiconductor film 20.

TABLE 1

|  | Step 1 | Step 2 | Step 3 |
| --- | --- | --- | --- |
| Treatment time | 30 sec | 600 sec | 30 sec |
| Polishing pressure | 1.0 kgf | 2.0 kgf | 1.0 kgf |
| Rotation speed | 30 rpm | 60 rpm | 30 rpm |

(Relief Structure Formation Step)

Figure 7D:
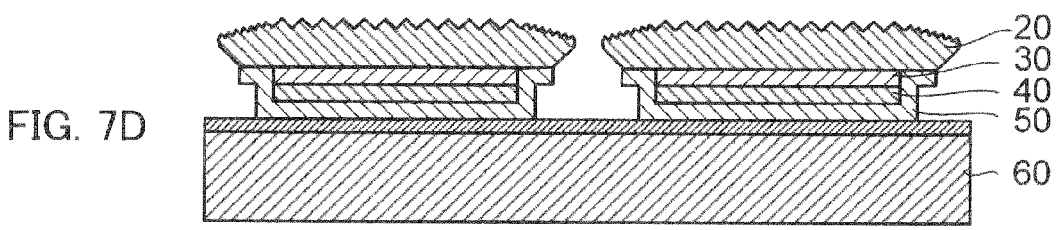
Figure 9:
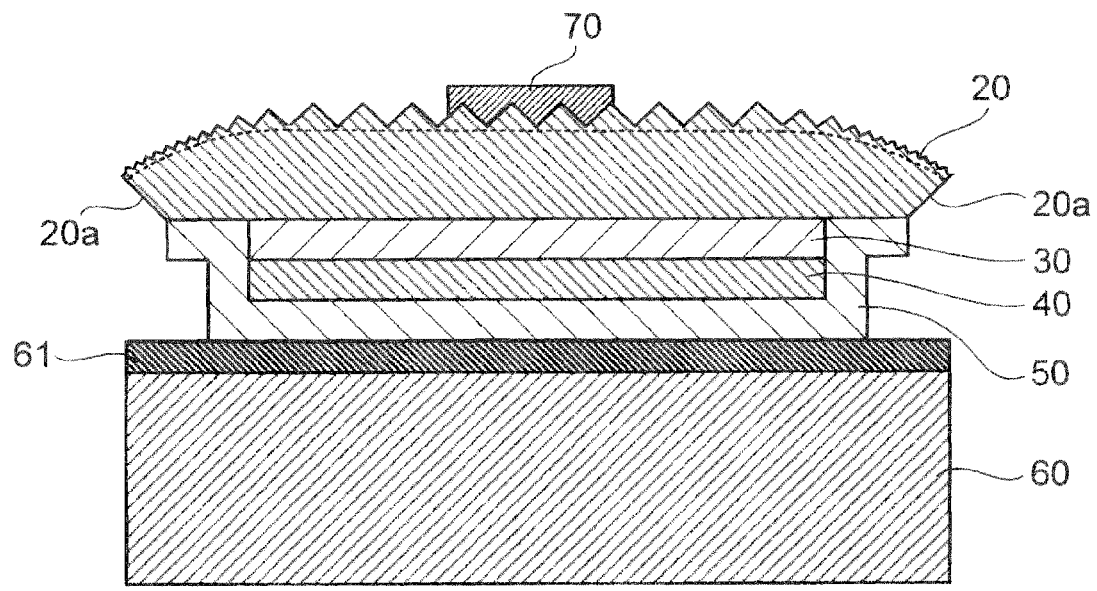
FIG. 9 is a cross-sectional view of the semiconductor light-emitting device according to the embodiment of the present invention.
Figure 10:
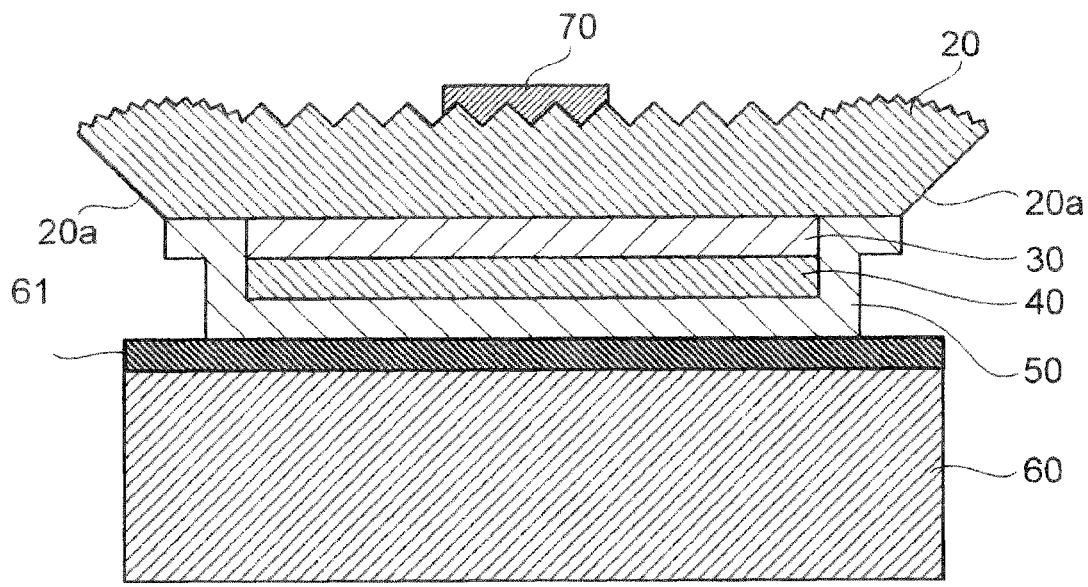
FIG. 10 is a cross-sectional view of the semiconductor light-emitting device according to the embodiment of the present invention.

The wafer is immersed in KOH having a temperature of 70° C. for 10 minutes, whereby the surfaces (C-plane) 20b, and the offset surfaces 20c offset from the C-planes, of the n-type GaN layer exposed by the removal of the sapphire substrate 10 are etched; and a relief structure comprising a plurality of hexagonal-cone-shaped protrusions originating from a wurtzite-type crystal structure are formed on the surfaces. The etching rate of the offset surfaces 20c is lower than the etching rate of the C-planes 20b. Therefore, the average size (average diameter) of the hexagonal-cone-shaped protrusions formed on the offset surfaces 20c is smaller than the average size (average diameter) of the hexagonal-cone-shaped protrusions formed on the C-planes 20b (FIG. 7D). The offset surfaces 20c may also include rounded curved surfaces as shown in FIG. 9. In such an instance, the size of the offset from the C-planes 20b gradually increases nearer the edge sections of the semiconductor film 20. Therefore, the size of the hexagonal-cone-shaped protrusions progressively decreases nearer the edge sections. FIG. 7D shows an instance in which the inclined profile due to the offset surfaces 20c remains even after etching. However, since the etching rate of the offset surfaces 20c is lower than the etching rate of the surface 20b, the vicinity of the edge sections of the semiconductor film 20 may assume a shape that is raised in relation to the center sections. Such differences in shape arise from etching conditions and other parameters, but irrespective of the shape, the size of the hexagonal-cone-shaped protrusions formed on the offset surfaces 20c remains smaller than that of the hexagonal-cone-shaped protrusions formed on the C-planes 20b.

(n-Electrode Formation Step)

Figure 7E:
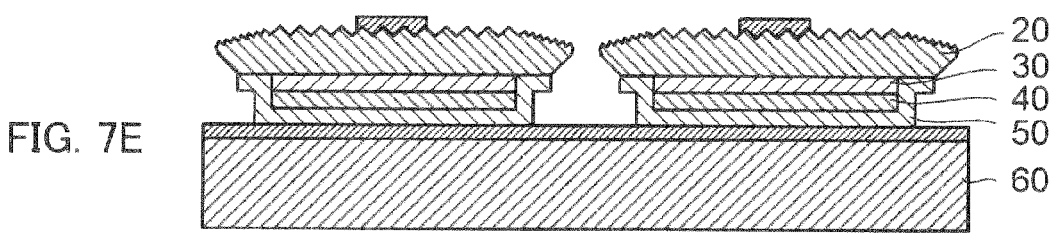

Ti and Al are sequentially vapor-deposited onto the surface of the n-type GaN layer of the semiconductor film 20 on which the relief structure is formed; then, patterning is performed by etching, lifting off, or another method; and the n-electrode 70 is formed (FIG. 7E). The semiconductor light-emitting device 1 is completed through the steps above.

According to the abovementioned manufacturing method of the embodiment of the present invention, it becomes possible, merely by adding the step for polishing the surface of the semiconductor film 20 to a conventional manufacturing process, to form hexagonal-cone-shaped protrusions having a smaller size (diameter) in the vicinity of the edge section (first region) of the surface of the semiconductor film than in the inside region (second region). In other words, according to the manufacturing method of the embodiment of the present invention, it becomes possible to manufacture, using a relatively simple method, a semiconductor light-emitting device having a higher light extraction efficiency than according to conventional techniques.

Another manufacturing method for improving the light extraction efficiency in the vicinity of the edge sections of the semiconductor film surface is a method in which a metal mask is formed in the vicinity of the edge sections of the surface of the semiconductor film exposed by the removal of the growth substrate, and subsequently performing wet etching for forming the relief structure. According to this method, no hexagonal-cone-shaped protrusions are formed in the vicinity of the edge sections of the semiconductor film surface, therefore making it possible to improve the light extraction efficiency in the corresponding region. However, according to this method, it is necessary to perform a large number of steps, such as photolithography, metal vapor deposition, lift-off, unevenness formation, and metal removal. Also, according to this method, the vicinity of the edge sections of the semiconductor film surface will be flat surfaces, and the effect of dispersing light will be lost; therefore, there is a risk that highly dense light will exit disproportionately in a specific direction. According to the manufacturing method of the embodiment of the present invention, it is possible to obtain an enhancement to the light extraction efficiency without causing these problems.

Figure 1B:
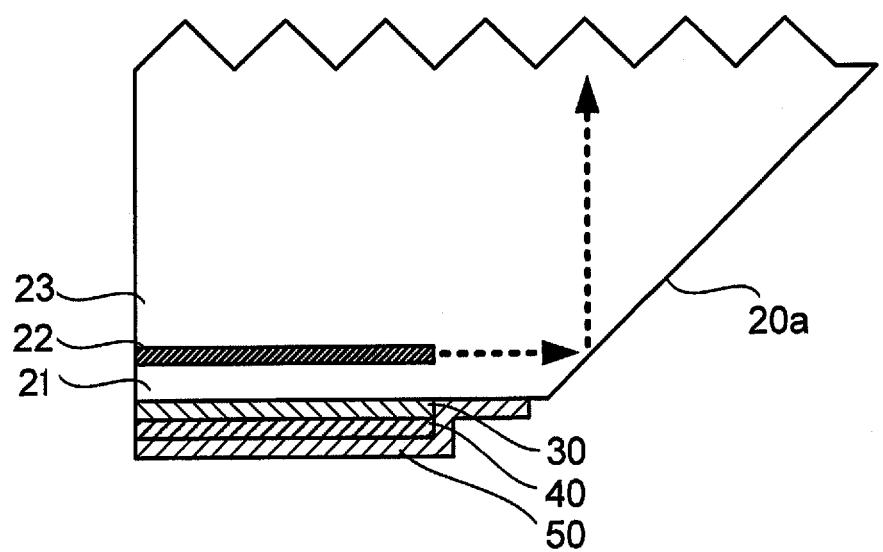
FIG. 1B is an expanded cross-sectional view of the vicinity of an edge section of the semiconductor film 20 forming the semiconductor light-emitting device.
Figure 11:
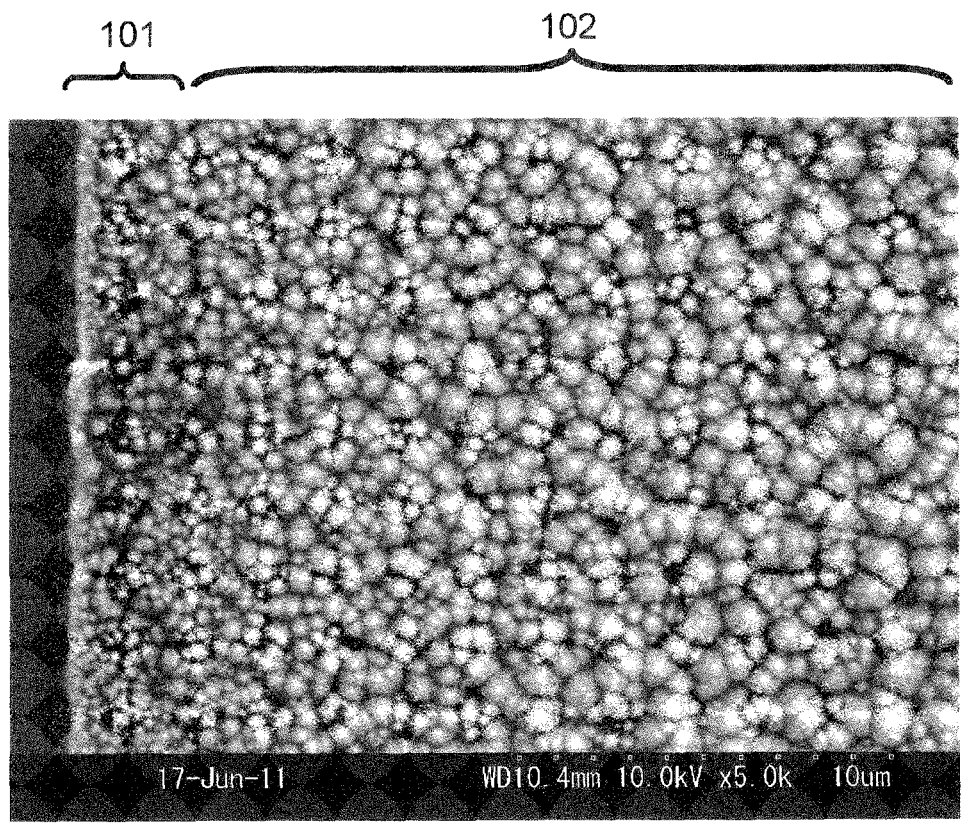
FIG. 11 is a SEM photograph of the surface of a semiconductor film having a relief structure formed through the manufacturing process according to the embodiment of the present invention.

FIG. 11 is a SEM photograph of the surface of the semiconductor film 20 in a semiconductor light-emitting device manufactured according to the manufacturing method of the embodiment of the present invention described above. It can be seen that the average size (diameter) of the hexagonal-cone-shaped protrusions in the first region 101 in the vicinity of the edge sections of the surface of the semiconductor film 20 is noticeably smaller than that in the second region 102. From among the hexagonal-cone-shaped protrusions formed in the first region 101 including the offset surface, those having a diameter less than 500 nm had an area occupancy of 76%. Meanwhile, of the hexagonal-cone-shaped protrusions formed in the second region 102 including the C-plane, the area occupancy of those having a diameter less than 500 nm, equal to or greater than 500 nm and less than 1.5 μm, and equal to or greater than 1.5 μm was 12%, 74%, and 14% respectively. According to the semiconductor light-emitting device created using the manufacturing method according to the embodiment of the present invention described above, it was possible to enhance the light output over the conventional semiconductor light-emitting device shown in FIGS. 1A and 1B by about 2%.

Figure 12A:
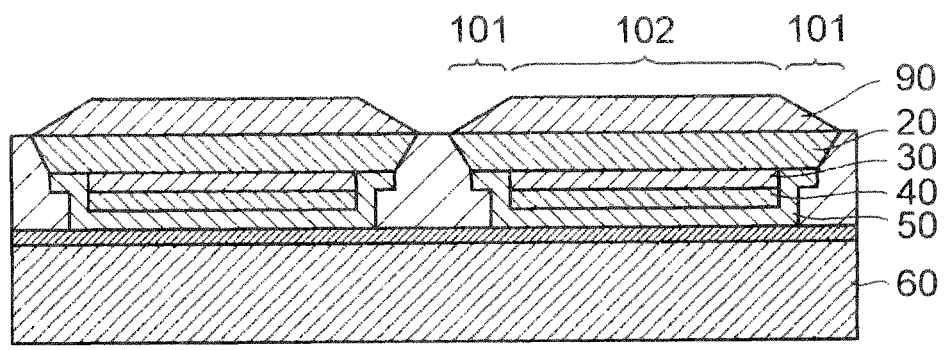
FIGS. 12A through 12C are cross-sectional views illustrating the method for manufacturing a semiconductor light-emitting device according to another embodiment of the present invention.
Figure 12B:
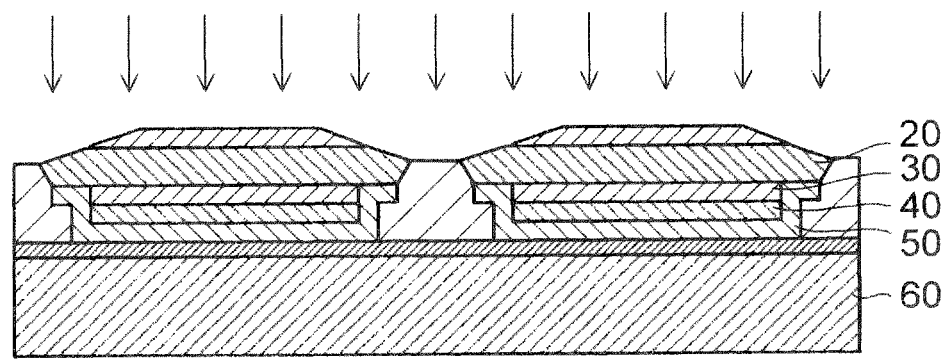
Figure 12C:
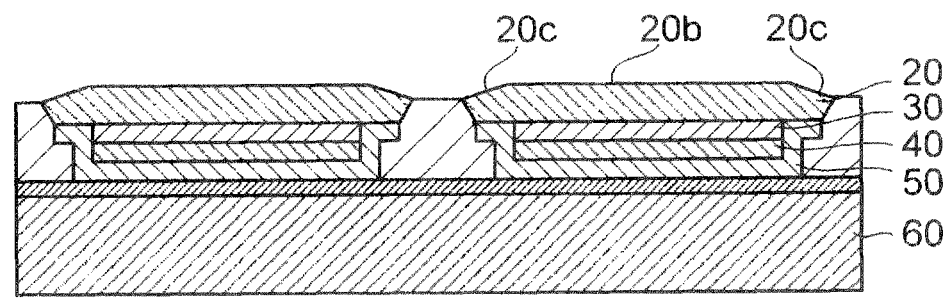

FIGS. 12A through 12C are cross-sectional views illustrating the manufacturing method of a semiconductor light-emitting device according to a second embodiment of the present invention. The process in the offset surface revealing step according to the manufacturing method according to the present embodiment is different from that according to the manufacturing method according to the first embodiment. The steps performed until the sapphire substrate is removed are similar to those according to the first embodiment, and a description shall therefore not be provided.

A resist 90 is formed on the surface of the semiconductor film 20 that has been exposed by the removal of the sapphire substrate. The resist 90 has a so-called tapered shape in which the film thickness gradually increases from the edge section of the semiconductor film 20 towards the second region 102. In other words, the film thickness changes continuously in the portion covering the first region 101 of the resist 90. the resist 90 having a tapered shape of such description can be formed, e.g., using the following procedure. A resist material (e.g., AZ6130 (Clariant Japan)) is applied to the surface of the semiconductor film 20. Next, heat processing is performed at 90° C. for 60 seconds (first bake). Next, using a predetermined mask, the resist material is exposed to light at 250 mJ/cm$^2$. Next, the resist material is solidified using heat treatment at 110° C. for 90 seconds (second bake). Next, developing is performed using a developing solution (e.g., AZ600MIF) and the resist material is patterned (FIG. 12A).

Next, the surface of the semiconductor film 20 is etched using RIE through the resist 90. This etching treatment results in the resist 90 being etched, and the edge sections of the surface of the resist 90 being exposed first. The exposed regions of the semiconductor film 20 gradually spread inwards. The vicinity of the edge sections of the semiconductor film 20 is etched to a shape corresponding to the tapered shape of the resist 90, and offset surfaces 20c that are offset from the C-plane 20b are revealed (FIG. 12B). Then, the resist 90 is removed (FIG. 12C). The subsequent steps are similar to those in the manufacturing method according to the first embodiment described above, and a description shall therefore not be provided.

Thus, according to the manufacturing method according to the second embodiment, it becomes possible to manufacture, using a relatively simple method, a semiconductor light-emitting device having a higher light extraction efficiency than that according to conventional techniques. Also, according to the manufacturing method according to the second embodiment, the boundaries between the C-planes 20b and the offset surfaces 20c are clear, and the size (diameter) of the hexagonal-cone-shaped protrusions therefore switch clearly at these boundaries.

What is claimed is:
1. A semiconductor light-emitting device, comprising:
a support substrate;
a reflection electrode bonded to the support substrate via a bonding layer; and
a semiconductor film disposed on the reflection electrode and made from a group III nitride semiconductor, the semiconductor film having a C-plane and including a light-emitting layer;
wherein the semiconductor film has:
a light extraction surface opposite to an interface between the semiconductor film and the reflection electrode, and
a tapered edge surface as a side surface that intersects with the light extraction surface at an edge around the semiconductor film, wherein the light extraction surface has an offset surface which is offset and terminates at the edge so that a size of an offset from the C-plane gradually increases nearer the edge, the offset surface being disposed immediately above the tapered edge surface, wherein the light extraction surface is occupied by a plurality of protrusions such that sizes of the protrusions on the offset surface progressively decrease nearer the edge, and an average size of the protrusions on the offset surface is smaller than an average size of the protrusions in a region of the light extraction surface surrounded by the offset surface from the edge, wherein at least 70% of the offset surface is occupied by protrusions each having a diameter smaller than a wavelength of light emitted from the light-emitting layer.

2. The semiconductor light-emitting device according to claim 1, wherein the region surrounded by the offset surface from the edge is disposed immediately above the reflection electrode.

3. The semiconductor light-emitting device according to claim 1, wherein at least 40% of the region surrounded by the offset surface from the edge is occupied by protrusions each having a diameter larger than a wavelength of light emitted from the light-emitting layer.

* * * * *